United States Patent [19]

Jerome et al.

[11] Patent Number: 4,903,087
[45] Date of Patent: Feb. 20, 1990

[54] SCHOTTKY BARRIER DIODE FOR ALPHA PARTICLE RESISTANT STATIC RANDOM ACCESS MEMORIES

[75] Inventors: Rick C. Jerome; Duncan A. McFarland, both of Puyallup, Wash.

[73] Assignee: National Semiconductor Corporation, Santa Clara, Calif.

[21] Appl. No.: 286,818

[22] Filed: Dec. 20, 1988

Related U.S. Application Data

[62] Division of Ser. No. 2,828, Jan. 13, 1987, abandoned.

[51] Int. Cl.$^4$ .............................................. H01L 29/48
[52] U.S. Cl. ..................................... 357/15; 357/52; 357/34; 365/175
[58] Field of Search ................. 357/15, 52, 41, 34; 365/175, 174

[56] References Cited

U.S. PATENT DOCUMENTS

| | | | |
|---|---|---|---|
| 3,924,264 | 12/1975 | Dorler et al. | 357/15 |
| 4,538,244 | 8/1985 | Sugo et al. | 357/15 |

FOREIGN PATENT DOCUMENTS 5992575 5/1984 Japan ........................................ 357/15

OTHER PUBLICATIONS

IBM Technical Disclosure Bulletin, Vol. 18 #6, p. 1829, Nov., 1975 by Freed et al.

*Primary Examiner*—Andrew J. James
*Assistant Examiner*—Mark Prenty
*Attorney, Agent, or Firm*—Lee Patch; Robert C. Colwell

[57] ABSTRACT

An improved Schottky barrier diode for increasing the alpha particle resistance of static random access memories includes an extra implanted N-type region at the surface of the epitaxial layer to increase the impurity concentration there to about $1 \times 10^{19}$ atoms per cubic centimeter. In one device, arsenic is employed to overcompensate a guard ring where the Schottky diode is to be formed, while in another device phosphorus is employed and the guard ring is not overcompensated. The resulting Schottky diodes, when employed in the static random access memory cells, dramatically increase the alpha particle resistance of such cells, while also substantially decreasing the access time.

12 Claims, 3 Drawing Sheets

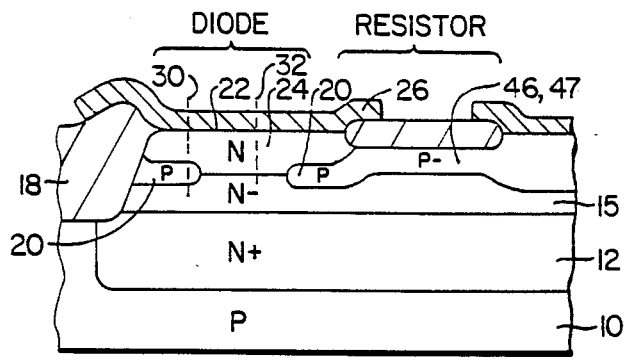
FIG._1.
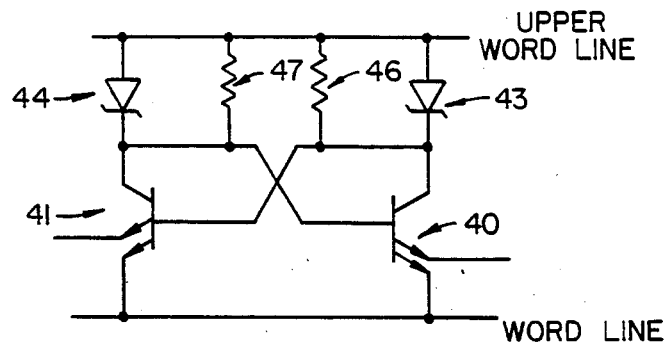
FIG._3.
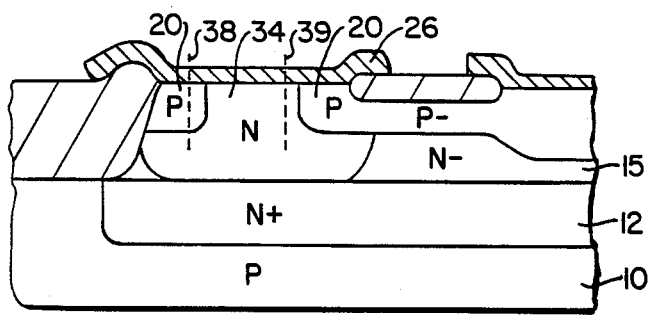
FIG._4.

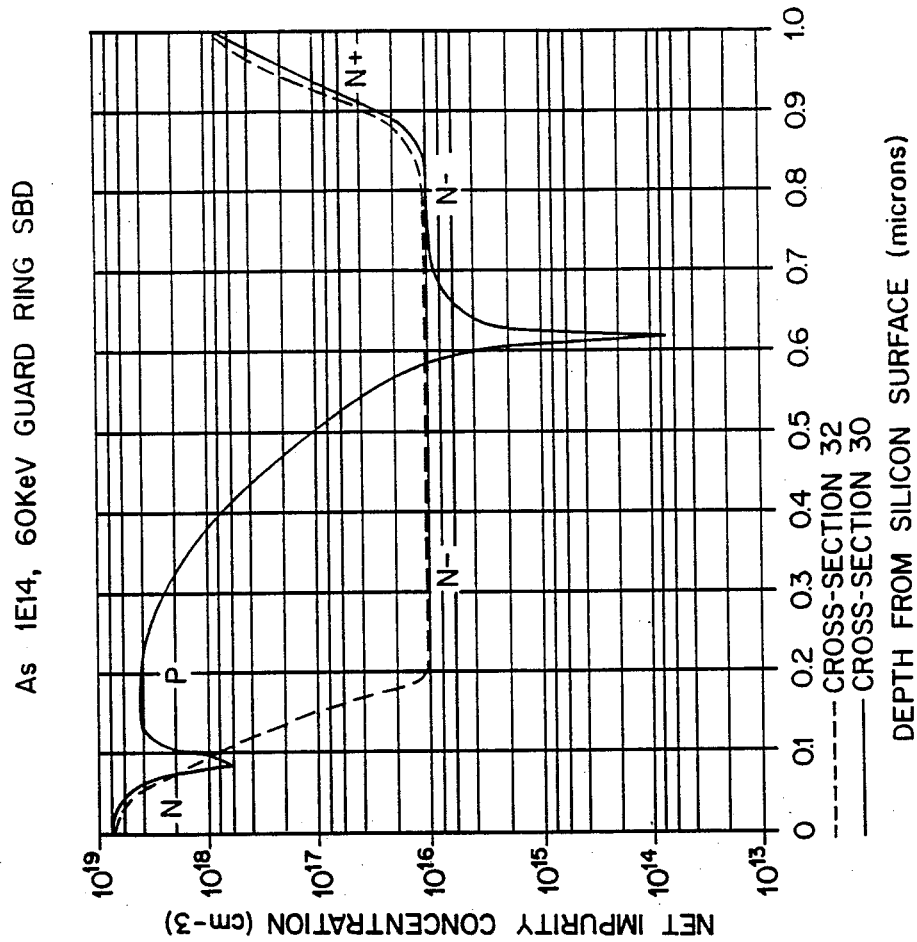
FIG._2.

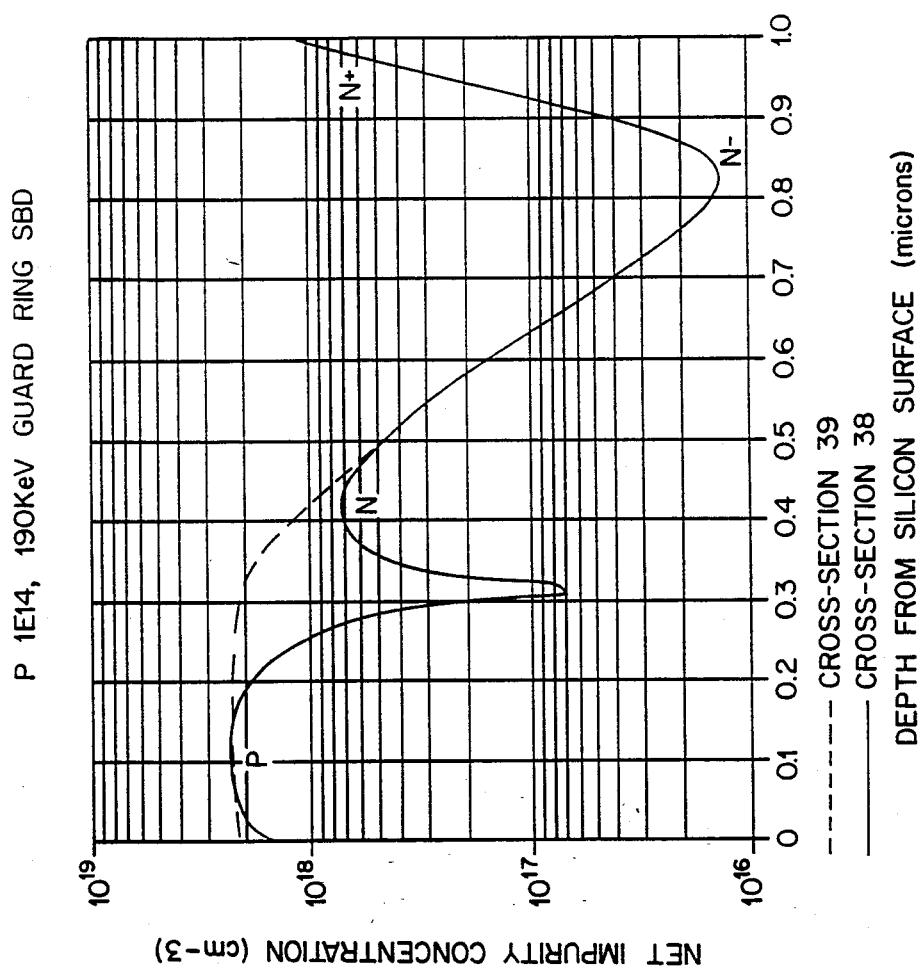
FIG._5.

SCHOTTKY BARRIER DIODE FOR ALPHA PARTICLE RESISTANT STATIC RANDOM ACCESS MEMORIES

This is a division of application Ser. No. 07/002,828 filed Jan. 13, 1987 and now abandoned.

BACKGROUND OF THE INVENTION

1. Field of the Invention

This invention relates to semiconductor devices and to a Schottky barrier diode for use in static random access memory cells. More particularly, the invention relates to a Schottky barrier diode structure and fabrication process in which an additional implant is employed to increase the metal-to-semiconductor junction capacitance.

2. Description of the Prior Art

A Schottky barrier diode is formed when a metal layer is deposited on lightly doped N-conductivity type semiconductor silicon. When the metal and the semiconductor are properly selected, the semiconductor acts as the N-type region of a diode. In a Schottky diode, electrons diffuse from the N-type semiconductor material and form a thin dense layer at the interface of the metal and the semiconductor. The forward current is carried by electrons flowing from the semiconductor to the metal contact. No recombination occurs because the injected electrons are also majority carriers in the metal.

A primary advantage of Schottky diodes is that they conduct at very low forward voltages, and thus switch rapidly. Schottky diodes therefore are widely applied in bipolar integrated circuits, such as static random access memory cells.

In bipolar circuits, Schottky diodes are formed by depositing a metal, typically aluminum, on an epitaxial silicon layer doped with an impurity concentration on the order of less than $1 \times 10^{16}$ atoms per cubic centimeter. Typically in static random access memory cells (SRAMs), a P-conductivity type guard ring is employed to reduce the electric field around the periphery of the diode.

Unfortunately, Schottky diodes fabricated according to the above approaches suffer from several disadvantages. First, as integrated circuit process technology continues to improve, memory cells are fabricated in smaller and smaller areas and thus, have less and less capacitance. The corresponding small Schottky diode area with low capacitance, in parallel with a load resistor, results in a high impedance which increases the time constant of the static random access memory cell and thereby results in undesirably slow access times. Potentially even more important, SRAM cells of the prior art with their low capacitance and low critical charge suffer from undesirably high soft error rates as a result of alpha particle impacts. In these prior art cells, the alpha particles change the state of the cell they impact, resulting in an error which must be corrected by software error detection and correction routines. While these routines can correct single bit errors in a word, two bit errors in a single word are not usually correctable, resulting in erroneous data or a system fault.

SUMMARY OF THE INVENTION

We have developed an improved Schottky barrier diode and a process for fabricating it which results in a diode having improved operational characteristics. Diodes fabricated according to our invention are highly advantageous for employment in SRAM cells because they have increased metal-to-semiconductor junction capacitance. The higher capacitance increases the memory cell critical charge and thereby reduces the soft error rate. Using our invention, the soft error rate of memory cells improved by a factor of 90,000 in one test. Furthermore, the Schottky diodes fabricated according to our invention have additional PN junction capacitance between the diode and guard ring, and this higher capacitance reduces the memory cell time constant, during a row select of SRAM cells, to thereby provide faster access times. In one embodiment access times improved from 5.2 nanoseconds to 4.5 nanoseconds, a 15% improvement.

In a preferred embodiment, a method of fabricating a Schottky diode to an N-conductivity type semiconductor region having a periphery at a surface includes the steps of: forming an annular P-conductivity type guard ring around the periphery of the region; introducing N-conductivity type impurity into the region to provide a surface concentration of more than $4 \times 10^{18}$ but less than $4 \times 10^{19}$ atoms per cubic centimeter, and depositing a metal contact on the surface of the region. In an embodiment where arsenic is employed as the N-type impurity, the guard ring is overcompensated at the surface and is thereby buried.

The structure of the Schottky diode fabricated according to our invention, in the preferred embodiment, includes a first region of N-conductivity type semiconductor material having an upper boundary, an annular region of P-conductivity type semiconductor material disposed in contact with the periphery of the upper boundary, a second region of N-conductivity type semiconductor material having an upper surface and having a lower boundary disposed in contact with both the first region and the annular region, and a metal contact disposed on the upper surface in contact with the second region.

BRIEF DESCRIPTION OF THE DRAWINGS

FIG. 1 is a cross-sectional view of a Schottky barrier diode fabricated according to a preferred embodiment.

FIG. 2 is a graph illustrating the impurity concentration at two cross sections of the structure of FIG. 1.

FIG. 3 is a schematic of a static random access memory cell employing a Schottky diode.

FIG. 4 is a cross-sectional view of a Schottky diode fabricated according to an alternate embodiment.

FIG. 5 is a graph illustrating the impurity concentration at two cross sections of the structure of FIG. 4.

DETAILED DESCRIPTION OF THE PREFERRED EMBODIMENTS

FIG. 1 is a cross-sectional view of a semiconductor structure fabricated according to a preferred embodiment of our invention. The structure of FIG. 1 includes a P-conductivity type semiconductor silicon substrate 10, a heavily doped N-conductivity type buried layer 12, and an overlying lightly doped N-conductivity type epitaxial layer 15. One portion of a region of silicon dioxide insulation 18 extending down to the PN junction between the buried layer 12 and the substrate 10 is shown at the left-hand edge of the figure. The isolation region extends annularly around the entire structure shown in FIG. 1 to electrically isolate this portion of the epitaxial layer 15 from the epitaxial layer elsewhere on the same chip. In this manner, active devices which are electrically isolated from all other devices on the chip may be fabricated in the "pocket" of epitaxial silicon 15. In the preferred embodiment, the structure of FIG. 1 is incorporated into a bipolar static random access memory cell.

The buried layer 12, epitaxial layer 15, and oxide isolation region 18 may be fabricated using well known semiconductor fabrication processes. One such process is described in U.S. Pat. No. 3,648,125 entitled "Method of Fabricating Integrated Circuits with Oxidized Isolation in the Resulting Structure," by Douglas Peltzer. Once the isolation regions are formed, then processes are employed to fabricate the structure shown in and on epitaxial layer 15. The processes used to fabricate the resistor are not within the scope of our invention, and the resistor is depicted in the figure to illustrate the relationship of the Schottky barrier diode structure of our invention to adjoining portions of a typical integrated circuit.

In integrated circuits of the prior art, the Schottky barrier diode was fabricated by simply forming a metal contact to the lightly doped N-type epitaxial layer 15. Typically, such epitaxial layers were doped with an impurity concentration of about $1 \times 10^{16}$ atoms per cubic centimeter of arsenic or phosphorus. The doping of such layers was primarily determined by the desired performance characteristics of transistors fabricated elsewhere on the wafer. In some prior art structures, a guard ring of P-conductivity type semiconductor material was fabricated at the surface of the epitaxial layer around the periphery of the diode region.

In a preferred embodiment of the process of our invention, the P-conductivity type impurity is introduced into the epitaxial layer through an opening in a mask to form a guard ring 20 which initially extends from the surface 22 of epitaxial layer 15 into the epitaxial layer. Preferably, the guard ring is doped with boron or other P-type impurity to a concentration of at least $1 \times 10^{18}$ atoms per cubic centimeter. The guard ring reduces the area of the Schottky contact to provide higher forward voltage and thereby greater memory cell margin. (The importance of cell margin is discussed further below.) Next, additional N-conductivity type dopant is introduced into the surface of the epitaxial layer to form a region 24 which is more strongly doped than the epitaxial layer. We employ either phosphorus or arsenic, with arsenic preferred. The arsenic provides a higher junction capacitance for the buried PN junction, as well as higher series resistance.

In the preferred embodiment, a low dose ion-implantation process is employed to increase the surface concentration of region 24 to approximately $1 \times 10^{19}$ atoms per cubic centimeter. It is necessary to assure that the dose does not exceed the level at which an ohmic contact is formed, that is, about $4 \times 10^{19}$ atoms per cubic centimeter. In the embodiment shown in FIG. 1, the dose of arsenic impurity 24 overcompensates the guard ring at the surface 22 and further into the epitaxial layer 15, but does not overcompensate the guard ring throughout the full thickness of epitaxial layer 15. As a result, the guard ring 20 becomes "buried" in epitaxial layer 15. In the preferred embodiment, region 24 is formed by implanting arsenic with an energy of about 60 KeV. An arsenic surface concentration of $1.2 \times 10^{19}$ atoms per cubic centimeter provides a Schottky capacitance of 10 femtofarads per square micron.

The fabrication of the Schottky diode is completed during a later stage of processing of the chip when a metal layer 26 is deposited and defined across the upper surface. Layer 26 will typically comprise aluminum, with a small amount of copper included to minimize electromigration, and a small percentage of silicon to minimize dissolution of the epitaxial layer 15 in the metal 26 at the time of deposition.

FIG. 2 is a graph illustrating the impurity concentration of the structure of FIG. 1 along cross sections 30 and 32 shown in FIG. 1. The solid line in FIG. 2 represents the impurity concentration along cross section 30, while the broken line in FIG. 2 represents the impurity concentration along cross section 32. FIG. 2 illustrates the doping profiles for an arsenic implant of $1 \times 10^{14}$ atoms per cubic centimeter at 60 KeV. With respect to cross section 30, the N-conductivity type impurity at the surface is almost $1 \times 10^{19}$ atoms per cubic centimeter and predominates for about the first 0.1 microns. The P-type guard ring then predominates until a depth of about 0.6 microns is reached. The lightly doped epitaxial layer and buried layer predominate for the remainder of the depth.

FIG. 3 is a schematic of a typical static random access memory cell in which the Schottky barrier diode of our invention may be employed. The memory cell includes a pair of cross-coupled bipolar transistors 40 and 41, and a pair of Schottky barrier diodes 43 and 44. Load resistors 46 and 47 are connected between an upper word line and the bases of the bipolar devices. The Schottky diodes 43 and 44 are serially connected between the upper word line and the collectors of the bipolar devices, and the emitters of the bipolar devices are connected to a lower word line. Some of the advantages of the process and structure of our invention may be appreciated with reference to FIG. 3.

The additional implanted impurity 24 (see FIG. 1) increases the metal-to-semiconductor junction capacitance substantially, for example, from 0.35 to 10 femtofarads per square micron of surface area. Because the memory cell critical charge, that is, the charge necessary to change the state of the memory cell, is directly proportional to the product of the capacitance multiplied by the cell margin, this substantial increase in capacitance results in a corresponding increase in the critical charge of the cell. The cell margin is the voltage difference between the bases of the bipolar devices 40 and 41. During selection of the memory cell, the cell margin will decrease temporarily as a result of the transient conditions in the cell. Because at this instant even a small amount of charge will change the state of the cell, the cell is unusually sensitive to alpha particle impact. The soft errors arise because alpha particle impacts generate electrons and holes. If the generated charge from the alpha particle is greater than the critical charge, the cell will change state. As SRAM cells become smaller and smaller, the critical charge becomes smaller and the alpha particle problem becomes more severe.

The increase in critical charge by our invention reduces the soft error rate of the cell dramatically, thus making it less susceptible to alpha particle impact.

During accelerated alpha particle testing, using a Thorium 230 source with 9.8 microcuries of radiation, a conventional SRL SRAM cell, for example, in a 1k ECL SRAM would have a soft error rate on the order of 1500 hits every 30 seconds (or 90,000 per half hour). In tests performed on structures manufactured according to our invention, the soft error rate was reduced to 1 hit every 30 minutes.

In addition, because it is introduced in parallel with the load resistors 46 and 47, the increased capacitance resulting from the additional dopant in region 24 reduces the impedance of the memory cell, and therefore the time constant, thereby providing faster access times. For example, without the arsenic implant 24, typical access times for the cell depicted are about 5.2 nanoseconds. In experiments, we have found that the access time after the implant is on the order of 4.5 nanoseconds, a substantial increase in speed.

FIG. 4 is a cross-sectional view of another embodiment of our invention in which phosphorus is employed in place of arsenic. The structure of FIG. 4 includes a silicon substrate 10, buried layer 12, and epitaxial layer 15 which are doped in a manner corresponding to those regions described in FIG. 1. Guard ring 20 is also formed in the same manner. In place of arsenic, however, a phosphorus implant 34 is used to dope the upper portion of epitaxial layer 15 more strongly. Although in some embodiments the phosphorus is implanted with a sufficiently high dose and low energy to overcompensate the guard ring 20 at the surface, for the embodiment depicted in FIG. 4, about $1 \times 10^{14}$ atoms per cubic centimeter of phosphorus have been implanted with an energy of 190 KeV. As a result, an insufficient amount of phosphorus is present to overcompensate guard ring 20 which extends to the surface of epitaxial layer 15. A phosphorus surface concentration of $2.1 \times 10^{18}$ atoms per cubic centimeter results in a Schottky capacitance of 4.7 femtofarads per square micron. This surface concentration is insufficient to overcompensate the $4 \times 10^{18}$ atoms per cubic centimeter concentration of the P-type guard ring. FIG. 5 illustrates the impurity concentration along cross sections 38 and 39 in FIG. 4.

The preceding has been a description of a preferred embodiment of the invention in which specific process parameters have been provided to explain our invention. The scope of the invention may be ascertained from the appended claims.

We claim:

1. A schottky diode structure comprising:
   a first region of N-conductivity type semiconductor material having an upper boundary;
   an annular region of P-conductivity type semiconductor material disposed in contact with a periphery of the upper boundary;
   a second region of N-conductivity type semiconductor material having a lower boundary disposed in contact with both the first region and the annular region and having an upper surface wherein the annular region is at a depth below the upper surface and not at the upper surface; and
   a metal contact disposed on the upper surface in contact with the second region.

2. A structure as in claim 1 wherein the first region has an impurity concentration of no more than $1 \times 10^{16}$ atoms per cubic centimeter.

3. A structure as in claim 1 wherein the second region has a impurity concentration of no less than $4 \times 10^{18}$ atoms per cubic centimeter and no more than $4 \times 10^{19}$ atoms per cubic centimeter.

4. A structure as in claim 1 wherein the metal contact comprises aluminum and silicon.

5. A structure as in claim 1 further comprising a buried layer of N-conductivity type semiconductor material disposed beneath and in contact with the first region.

6. A Schottky diode structure comprising:
   a first region of N-conductivity type semiconductor material having an upper surface;
   an annular region of P-conductivity type semiconductor material disposed to surround the first region at a selected depth below the upper surface and not at the upper surface;
   a metal contact disposed on the upper surface in contact with at least the first region; and
   wherein the first region has a surface N-type impurity concentration of more than $2 \times 10^{18}$ atoms per cubic centimeter and less than $4 \times 10^{19}$ atoms per cubic centimeter.

7. A structure as in claim 6 wherein the N-type impurity comprises phosphorus.

8. A structure as in claim 6 wherein the N-type impurity comprises arsenic.

9. A structure as in claim 8 wherein the N-type impurity concentration is about $\times 10^{19}$ atoms per cubic centimeter.

10. A static random access memory cell including a first and a second Schottky diode each comprising:
    a first region of N-conductivity type semiconductor material having an upper surface;
    an annular region of P-conductivity type semiconductor material disposed to surround the first region at a selected location wherein the annular region is at a depth below the upper surface and not at the upper surface;
    a metal contact disposed on the upper surface in contact with at least the first region; and
    wherein the first region has a surface N-type impurity concentration of more than $2 \times 10^{18}$ atoms per cubic centimeter and less than $4 \times 10^{19}$ atoms per cubic centimeter.

11. A memory cell as in claim 10 further including:
    a first bipolar transistor having a base connected to a first node, a collector connected to a second node, and an emitter connected to a third node;
    a second bipolar transistor having a base connected to the second node, a collector connected to the first node, and an emitter connected to the third node; and
    wherein the first Schottky diode is connected between a fourth node and the first node and the second Schottky diode is connected between the fourth node and the second node.

12. A memory cell as in claim 11 further including first and second resistors connected in parallel with corresponding Schottky diodes.

* * * * *